United States Patent [19]
Cutchaw

[11] 3,904,262
[45] Sept. 9, 1975

[54] CONNECTOR FOR LEADLESS INTEGRATED CIRCUIT PACKAGES

[76] Inventor: John M. Cutchaw, 7333 E. Virginia, Scottsdale, Ariz. 85257

[22] Filed: Sept. 27, 1974

[21] Appl. No.: 509,855

[52] U.S. Cl. ...... 339/17 CF; 339/75 MP; 339/112 R
[51] Int. Cl.$^2$ ...................... H05K 1/00; H01R 13/54
[58] Field of Search ............ 339/17 R, 17 C, 17 CF, 339/17 L, 75 M, 75 MP, 112

[56] References Cited

UNITED STATES PATENTS

| | | | |
|---|---|---|---|
| 3,391,383 | 7/1968 | Antes | 339/17 CF X |
| 3,700,788 | 10/1972 | Spurck | 339/17 CF X |
| 3,771,109 | 11/1973 | Bruckner et al. | 339/17 CF X |
| 3,831,131 | 8/1974 | Woodcock et al. | 339/17 CF X |
| 3,846,737 | 11/1974 | Spaulding | 339/17 CF X |
| 3,877,064 | 4/1975 | Scheingold et al. | 339/17 CF X |

*Primary Examiner*—Joseph H. McGlynn
*Assistant Examiner*—Craig R. Feinberg
*Attorney, Agent, or Firm*—Herbert E. Haynes, Jr.

[57] ABSTRACT

A connector for demountably attaching a leadless integrated circuit package to an electrically interconnecting backpanel includes a base receptical mounted on the backpanel and having contact means therein which are in contact with the backpanel. The base receptical is adapted to receive the circuit package therein so that the terminal pads thereof are in alignment with the contact means provided in the base receptical. A cover is removably mounted in the base receptical for lateral sliding movement relative thereto, and a wedge action will deflect and lock to cover in place which loads the terminal pads of the circuit package into conductive contact with the contact means of the base receptical.

11 Claims, 7 Drawing Figures

CONNECTOR FOR LEADLESS INTEGRATED CIRCUIT PACKAGES

BACKGROUND OF THE INVENTION

1. Field of the Invention

This invention relates to electrical connectors and more particularly to a connector for leadless integrated circuit packages.

2. Description of the Prior Art

The need for an improved integrated circuit packaging system has become critical, from a profit standpoint, with companies that are trying to use highly developed electronic technology in commercial and consumer applications such as automotive, appliance, communication, industrial components, industrial systems, and the like.

The need stems from the inability of the otherwise excellent dual-in-line package (DIP) to physically meet manufacturing, testing, assembly, and servicing requirements that are being imposed thereon. This problem is due to the leads of the DIP not being strong enough for the manual and mechanical handling that they are receiving as they are being employed in a variety of new products.

The leads of the DIP are stamped out of a corrosion resistant alloy especially developed to provide an electrical conductor with ideal properties for connecting discrete solid state electronic circuits to the outside world. This special alloy is reasonably rigid but the sheet thickness range best suited for internal and external connection is too thin when those leads are subjected to repeated handling. Scrap parts due to broken leads and labor costs required to straighten bent leads, moniter insertion and handling equipment on the assembly lines and diagnosing of electrical problems both in the plant and in the field, are very costly to the user, and it has been estimated that lead defects account for as much as 20 percent of production losses at the point of manufacture.

This problem with the leads of integrated circuit packages, along with the desire to reduce costs, has led to the development of leadless integrated circuit packages of both the dual-in-line type and what has become known as the 2 × 2 substrate. In place of leads, these leadless packages employ terminal pads located adjacent the edges of a flat ceramic substrate, and the terminal pads are connected to discrete solid state circuits mounted on the substrate. The dual-in-line leadless package is usually rectangular and the terminal pads are located adjacent the opposite longitudinal edges. The 2 × 2 substrate is square and is usually provided with terminal pads adjacent each of its peripheral edges. Specific positioning of the terminal pads is accomplished in three ways which are referred to as: facemount, sidemount, and edgemount. The facemount technique places the terminal pads on one face, or planar surface, of the substrate with the pads disposed adjacent to at least two edges. The sidemount technique locates to terminal pads on two opposite edges of the substrate so that the pads are disposed in planes which are perpendicular to the planar surfaces of the substrate. The edgemount technique is similar to the commonly employed method used with printed circuit boards in that the pads are located on both planar surfaces of the substrate and are located adjacent to the same one edge thereof.

Commercial acceptance of these leadless packages has been relatively slow due to various problems such as connectors for mounting and electrically interconnecting the packages with a backpanel such as a printed circuit board or wiring panel.

Various connector configurations have been employed or suggested for the various leadless connectors, with these prior art connectors being relatively bulky and multi-part complex structures. Since the use of terminal pads dictates that a pressure type of interconnection be employed, the forces needed to achieve reliable connections becomes quite large and can become a serious problem when relatively large numbers of interconnections are to be made.

One particular prior art connector employs a base which is mounted on the backpanel by soldering or otherwise attaching the wire wrap pins, which depend from the base, into the backpanel. The leadless package is mounted within a recess provided in the base and the terminal pads of the package are pressurized into conductive contact with upwardly extending portions of the wire wrap pins. The necessary downward pressurization is accomplished by means of a cover hingedly mounted on the base. This, and similar prior art connectors are usually employed only on relatively small leadless packages of the type having terminal pads on only two edges thereof due to the inability of such connectors to achieve equal pressurization over long spans and on packages having terminal pads on more than two edges.

Another type of prior art connector employs a base, similar to the one described above, for receiving the leadless package. A force exerting element is placed on the leadless package and is pressurized downwardly by means of a cover which is screwed in place. The screws are located only at the corners or ends of such connectors, as determined by the geometric configuration, so as not to sacrifice valuable contact space. Such a mounting technique complicates servicing and when relatively large leadless packages are mounted in this type of connector, uneven contact pressurization can result in the spans between the mounting screws due to deflection or bowing of the cover and the force exerting element.

In view of the foregoing, a need exists for a new and improved connector for leadless integrated circuit packages which overcomes some of the problems of the prior art.

SUMMARY OF THE INVENTION

In accordance with the present invention, a new and useful connector for leadless integrated circuit packages is disclosed which may be configured to accommodate various sizes and shapes of such packages, and may also be configured to employ any of several types of electrical interconnecting techniques so as to be compatable with the variety of printed circuit boards or wiring panels currently in use.

The connector of the present invention includes a base receptical for mounting on the backpanel to which the integrated circuit packages are to be electrically coupled. The base receptical is formed with a chamber therein for receiving the leadless package so that the terminal pads thereof align with contact means provided in the chamber of the base. The contact means extend from the chamber of the base and are adapted to be coupled to the backpanel in any manner suited to the particular type of backpanel, and electrical interconnection between the terminal pads of the leadless package and the contact means of the connector is accomplished by exerting a force on the leadless package to form a pressure connection therebetween. The force needed to form these pressure connections is provided by a cover having wedge members disposed substantially about the periphery thereof which align with and coact with inclined plane members formed in the base to produce a force vector that is substantially evenly applied about the periphery of the leadless package when the cover is slidingly moved relative to the base.

Accordingly, it is an object of the present invention to provide a new and useful connector for leadless integrated circuit packages.

Another object of the present invention is to provide a new and useful connector for leadless integrated circuit packages that may be configured to accommodate various sizes and shapes of such packages.

Another object of the present invention is to provide a new and useful connector for leadless integrated circuit packages which may be configured to be compatible with various types of backpanels.

Another object of the present invention is to provide a new and improved connecter for leadless integrated circuit packages which produces a substantially evenly distributed force to pressurize the terminal pads of the leadless package into conductive contact with contact means provided in the connector.

The foregoing and other objects of the present invention, as well as the invention itself, may be more fully understood from the following description when read in conjunction with the accompanying drawings.

DESCRIPTION OF THE PREFERRED EMBODIMENTS

Figure 1:
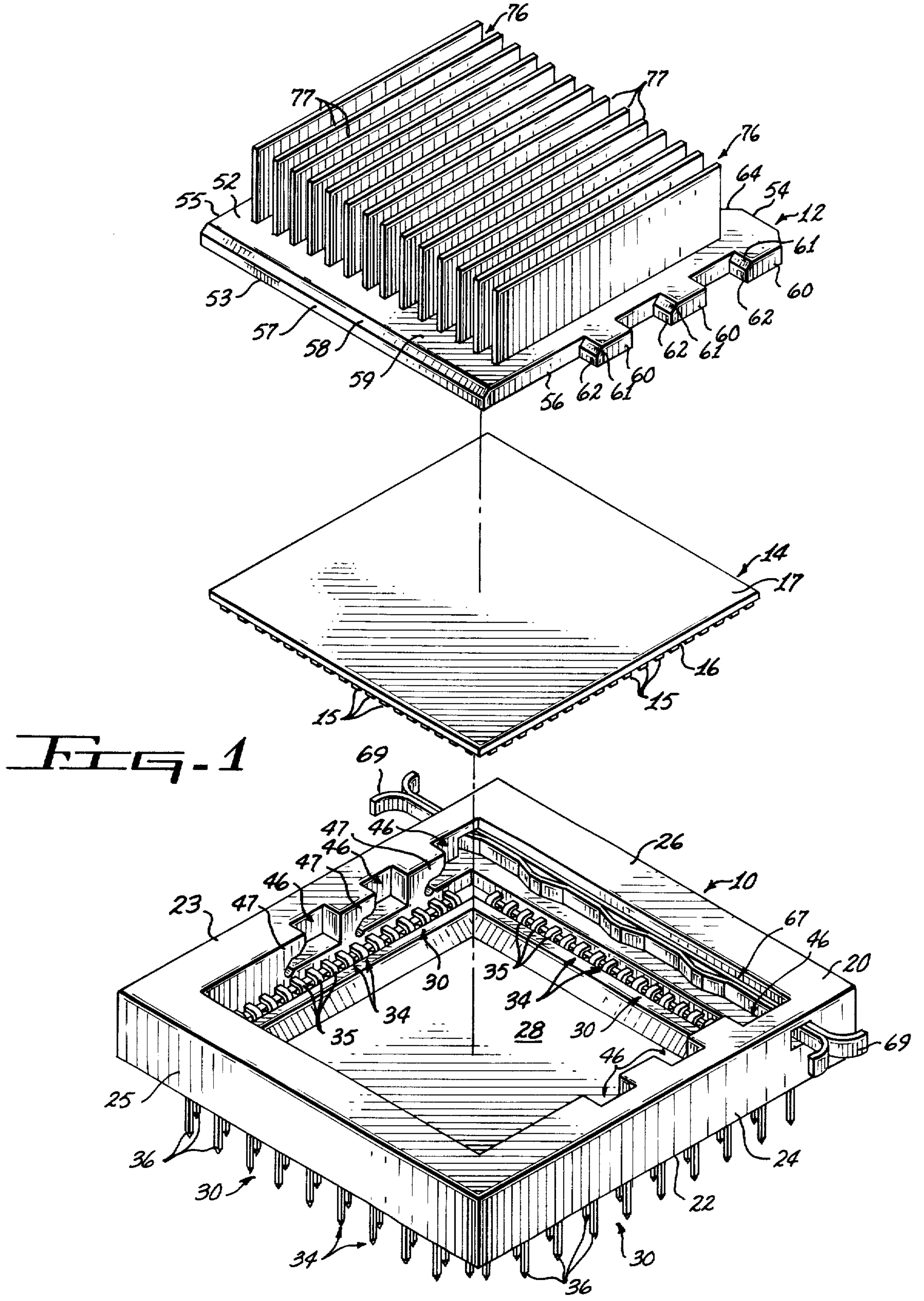
FIG. 1 is an exploded isometric view of the connector of the present invention illustrating the various features thereof.

Referring more particularly to the drawings, FIG. 1 shows the connector of the present invention as including a base assembly 10 and a cover assembly 12 for mounting a leadless integrated circuit package 14 as will hereinafter be described in detail.

The leadless integrated circuit package 14 is of the type sometimes referred to a facemounted 2 × 2 substrate with that name denoting the manner in which the package is to be mounted as well as the physical size and geometric configuration thereof. This type of package 14 is of square configuration having a dimension of 2 inches per side, and has a plurality of terminal pads 15 on one surface 16 of a planar substrate 17. The terminal pads 15 are positioned adjacent to at least one peripheral edge of the planar substrate 17 and are very often disposed adjacent all four peripheral edges thereof. Discrete integrated circuits (not shown) are mounted on the surface 16 of the substrate 17 and are electrically interconnected with the terminal pads 15 in a well known manner. In many instances, the package 14 is provided with a cover 18 (FIG. 3) for enclosing and protecting the discrete circuits (not shown).

It should be understood that the leadless integrated circuit package 14 is shown only for clarity and completeness of the disclosure and that other well known types of packages, such as a dual-in-line leadless package (not shown) would have served this purpose equally as well. It should therefore be apparent that the geometric configuration of the connector of the present invention, which is shown as being substantially square to accommodate the 2 × 2 substrate package 14, could just as easily be formed in a rectangular configuration to accommodate the usual rectangular shape of the dual-in-line leadless packages (not shown).

As seen best in FIGS. 1 through 4, the base assembly includes a housing 20 formed of suitable dielectric material such as polycarbonate, polypropylene and the like. As will become apparent as this discription progresses, relatively large forces will exist when the terminal pads are pressure connected within the connector of the present invention, and therefore it is recommended that the material of which the housing 20 is fabricated be reinforced such as with glass fibers.

The housing 20 is shown as having a bottom 22 with upstanding spaced apart side walls 23 and 24 and upstanding spaced apart end walls 25 and 26.

The bottom 22 along with the side and end walls 23 through 26 of the housing 20 form the enclosed bottom and perimeter of an upwardly opening chamber 28 provided within the housing. The chamber 28 formed in the housing 20 is configured to receive the leadless package 14 therein as will hereinafter be described in detail.

Figure 3:
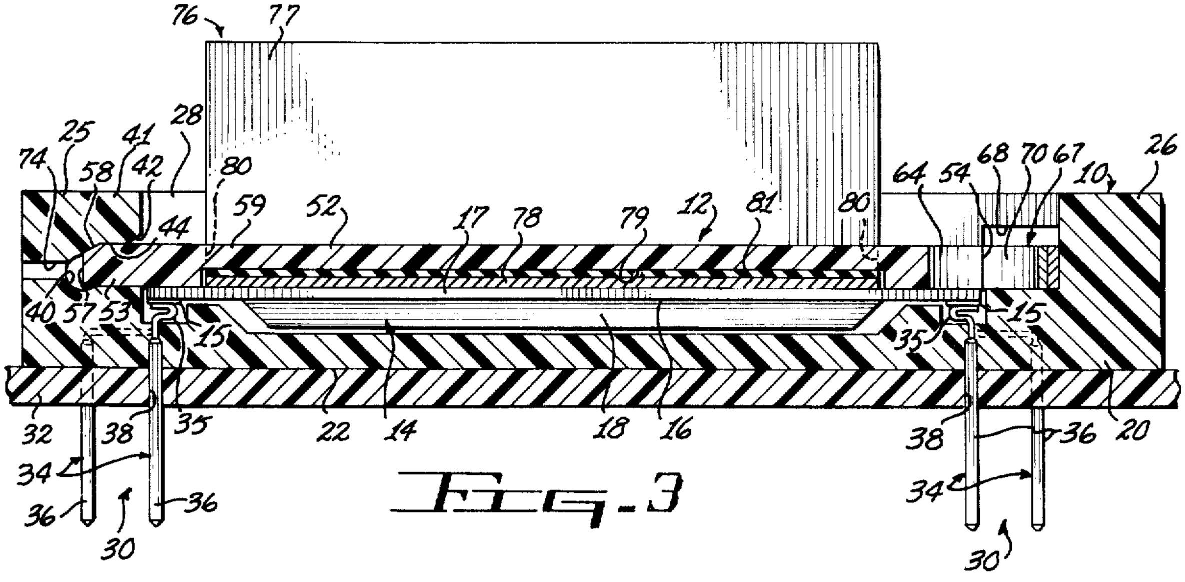
FIG. 3 is a sectional view taken on the line 3—3 of FIG. 2.

The base assembly 10 also includes electrical interconnecting means 30 for electrically interconnecting the leadless package 14 with a suitable wiring board or backpanel 32 (FIG. 3). In this embodiment of the present invention, the electrical interconnecting means 30 is shown to include a plurality of conductive elements 34 which are embedded in the bottom 22 of the housing 20 and each of which is formed with a spring contact portion 35 extending upwardly from the bottom 22 into the chamber 28 of the housing 20, and a pin portion 36 depending from the bottom 22 of the housing. The conductive elements 34 are formed of a suitable electrically conductive material such as phosphor bronze, beryllium copper and the like, and may be of one piece construction or may be fabricated by suitably affixing the spring contact portions 35 to the pin portions 36.

The conductive elements 34 are arranged so as to match the spacing and layout of the terminal pads 15 of the leadless package 14 so that when the package 14 is placed within the chamber 28 of the housing 20, the terminal pads will be in vertical alignment with the spring contact portions 35 of the conductive elements. Therefore, to accommodate the leadless package 14 when that package has the terminal pads 15 thereof alignedly arranged adjacent each of the peripheral edges of its substrate 17, the conductive elements 34 would be similarly aligningly arranged within the chamber 28 of the housing 20 adjacent each of the upstanding side and end walls 23–26 thereof. Likewise, if the package 14 has the terminal pads 15 thereof aligningly arranged adjacent to less than all of the peripheral edges of the substrate 17, the housing 20 need only be provided with a corresponding aligned arrangement of conductive elements 34. It should be apparent that the conductive elements 34 could be arranged within the chamber 28 of the housing 20 to accommodate virtually any array of terminal pads 15 provided on the surface 16 of the substrate 17 of the leadless package 14, such as plural parallel rows of terminal pads (not shown), staggered terminal pads (not shown) and the like.

The spring contact portions 35 of the conductive elements 34 are formed into horizontally disposed U-shaped members which are vertically compressible and will exert a counteracting force when attempts are made at such vertical compression. In this manner, when the terminal pads 15 are pressed downwardly, as will hereinafter be described in detail, a gas tight conductive contact is formed between the terminal pads 15 and the aligned spring contact portions 35 of the conductive elements 34.

The pin portions 36 of the conductive elements 34 are in the form of the well known wire wrap pin, and as shown in FIG. 3, may be assembled to the backpanel 32 so as to protrude therethrough and thus expose the extending ends thereof for wire wrapping purposes as is well known in the art. Attachment of the pin portions 36 to the backpanel 32 may be accomplished in the well known manner of providing an interference fit of the pins within apertures 38 formed in the backpanel. Alternately, the pin portions 36 may be solder connected to the backpanel 32 (not shown) which is another well known technique. In either event, affixing the pin portions 36 to the backpanel or wiring panel 32 will also serve to mount the base assembly 10 thereto.

As hereinbefore mentioned, electrical interconnection of the terminal pads 15 of the package 14 with the spring contact portions 35 of the conductive elements 34 is made by a pressure connection. In the connector of the present invention, the force necessary to achieve such a pressure connection is derived from the manner in which the cover assembly 12 is mounted to the base assembly 10.

Figure 4:
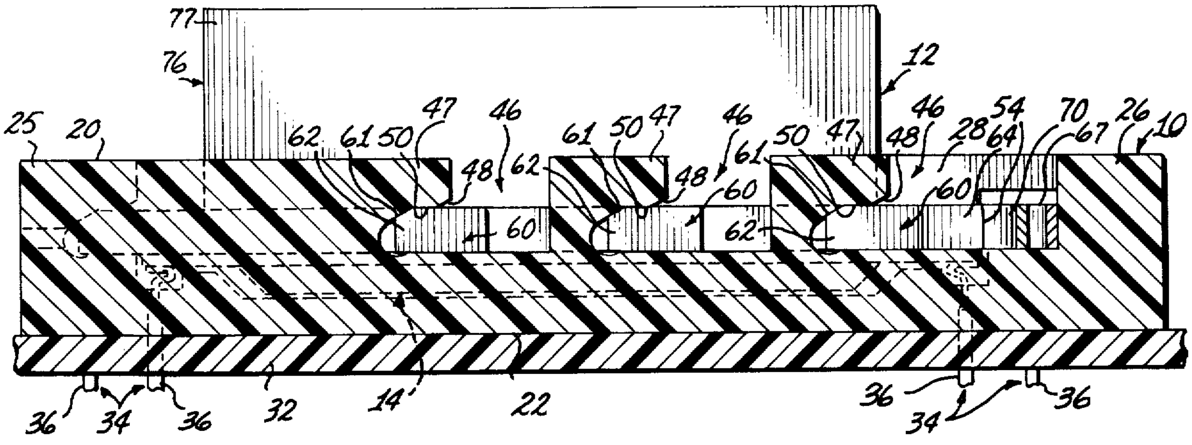
FIG. 4 is a sectional view taken on the line 4—4 of FIG. 2.

Toward this end, an elongated slot 40 is formed in the end wall 25 of the housing 20. The slot 40, as best seen in FIG. 3, is disposed so as to open into the chamber 28 of the housing 20 to provide an elongated inwardly extending end wall cantilevered ledge 41 the downwardly facing surface of which is configured to provide an inclined plane surface 42 and a detent surface 44. Each of the spaced apart side walls 23 and 24 of the housing 20 are formed with a plurality of spacedly arranged and inwardly opening notches 46, which, as best seen in FIG. 4, are each provided with a side wall cantilevered ledge 47. The side wall cantilevered ledges 47 of the notches 46 are coplanar with and disposed to extend in the same direction as the end wall cantilevered ledge 41 of the slot 40, and are each configured similarly in that the downwardly facing surfaces thereof are provided with an inclined plane surface 48 and a detent surface 50. Both the elongated slot 40 and the spacedly arranged notches 46 serve as a cover deflecting and locking means as will hereinafter be described in detail.

The cover assembly 12 comprises a cover body 52 which is a planar structure configured to mount atop the leadless package 14 within the chamber 28 of the housing 20. The cover body 52 is formed with a leading edge 53, a trailing edge 54, and a pair of spaced apart side edges 55 and 56. The leading edge 53 of the cover body 52 is provided with a vertical surface 57, which is normal to the planar surfaces of the cover body, and an inclined plane surface 58 which slopes angularly upwardly and rearwardly from the vertical surface 57 to the upper surface 59 of the cover body 52. The side edges 55 and 56 of the cover body 52 are each formed with a plurality of spacedly arranged laterally extending ears 60. Each of the extending ears 60 have a leading edge 62, similar to the leading edge 53 in that the edges 62 are parallel with and face in the same direction as the edge 53. Each of the leading edges 62 of the ears 60 have an inclined plane surface 61 each of which is disposed to face in the same direction as the inclined plane surface 58 of the leading edge 53, and is parallel therewith. The leading edge 53 of the cover body 52 and the leading edges 62 of the extending ears 60 serve as wedge means by which the cover body 52 is deflected and locked in the desired position within the chamber 28 of the housing 20 by coacting with the deflecting and locking means provided in the housing 20.

Assembly of the cover assembly 12 within the chamber 28 of the housing 20 is accomplished by vertically aligning the ears 60 of the cover with the notches 46 of the housing 20 and lowering the cover into the chamber 28. This action will position each of the ears 60 laterally adjacent to the side walls cantilevered ledges 47 of their respective notches 46 and will position the leading edge 53 of the cover body 52 laterally adjacent the elongated slot 40 of the housing 20. An initial lateral sliding movement of the cover body 52 toward the slot 40 will bring the inclined plane surface 58 of the leading edge 53 into engagement with the inclined surface 42 of the slot 40 and simultaneously bring the inclined plane surfaces 61 of the ears 60 into engagement with the inclined plane surfaces 48 of their respective ones of the notches 46. Continued lateral sliding movement of the cover body 52 will deflect that body downwardly so as to exert an evenly distributed force on the leadless package 14 thereby resulting in conductive contact between the terminal pads 15 of the package and the spring contact portions 35 of the conductive elements 34. This same continued lateral sliding movement of the cover body 52 will bring the upper surface 59 of the cover body into contact with the detent surface 44 of the slot 40 and will simultaneously bring the upper surfaces of the extending ears 60 into contact with the detent surfaces 50 of their respective one of the notches 46, thus, resulting in locking the cover body in the downwardly deflecting position.

The lateral sliding movement of the cover assembly 12 may be accomplished in any convenient manner such as by hand. However, in instances where the number of pressure connections to be made is relatively large, such as in the case of a 2 × 2 substrate having forty terminal pads per side, the use of tooling may be required to effect the necessary sliding movement of the cover assembly 12.

To accomplish the above described sliding movement of the cover assembly 12, the trailing edge 54 of the cover body 52 is provided with a plurality of recesses 64 formed in evenly spaced increments along the length thereof. Each of these recesses 64 has a pair of vertically disposed cam surfaces 65 which converge inwardly from the trailing edge 54 of the cover body and terminate at a flat surface 66 formed at the innermost portion of the recess. Tool means 67 is provided in the housing 20 between the trailing edge 54 of the cover body 52 and the upstanding end wall 26 of the housing. The tooling means 67 bears against the end wall 26 of the housing 20 and is slidably movable therealong in a direction transverse to the direction of sliding movement of the cover body 52. The upstanding side walls 23 and 24 of the housing 20 each have a passage 68 formed therethrough and these passages 68 are in alignment with each other to accommodate the opposite ends of the tooling means 67 and allow the sliding movement thereof. The opposite ends of the tool means 67 are each formed into a hook member 69 by which the tool means can be grasped. Intermediate the opposite ends of the tool means 67 there is provided a plurality of projections 70 in evenly spaced increments along the length thereof with each of these projections 70 having a pair of vertically disposed cam surfaces 71 which converge toward a flat surface 72 formed on the extending end of the projection.

Figure 2:
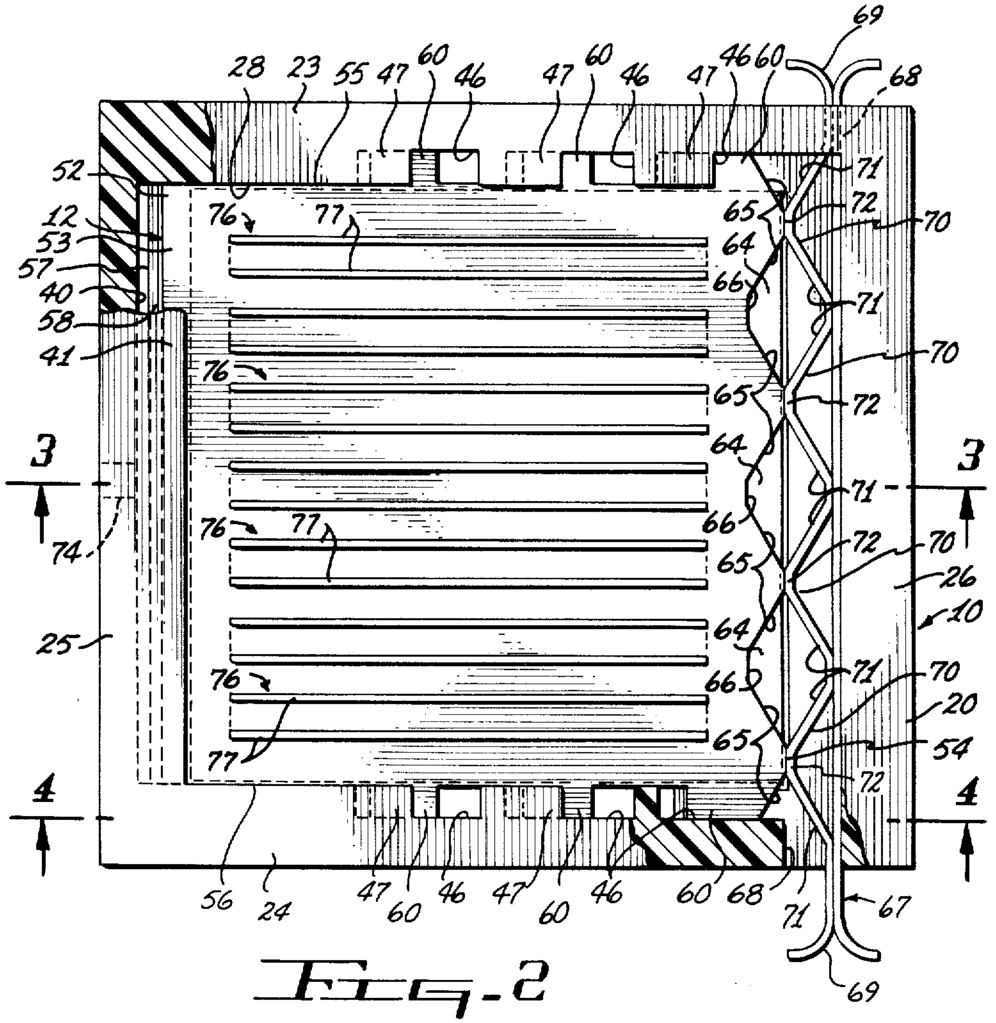
FIG. 2 is an enlarged plan view of the connector of the present invention partially broken away to illustrate the features thereof.

The incremental spacing of the recesses 64 of the cover body 52 and the incremental spacing of the projections 70 of the tool means 67 are the same so that a nestingly aligned fit therebetween exists when the cover body 52 is lowered into the chamber 28 of the housing 20. The sliding movement of the cover body 52 is achieved by sliding the tool means 67, as previously described, so that the cam surfaces 71 thereof will bear against the cam surfaces 65 of the recesses 64 which causes the cover body to move, thus, engaging the wedge means of the cover essembly 12 with the deflecting and locking means of the housing 20. When the sliding movement of the cover body 52 is completed, the flat surfaces 72 of the projections 70 will be in engagement with the trailing edge 54 of the cover body 52 as shown in FIG. 2, to provide locking means therebetween which prevents undesired reverse movement of the cover assembly 12 which could otherwise occur as a result of equipment vibration and the like. It should be noted that the locking action provided by the tool means 67 cooperates with the detent action, provided by engagement of the cover body 52 within the elongated slot 40 and the notches 46, to doubly insure against reverse sliding movement of the cover assembly.

To remove the cover assembly 12, such as could be required for servicing and replacement of the leadless package 14, the tool means 67 is slidingly moved back to its original, or starting position to align the projections 70 of the tool means 67 with the recesses 64 of the cover body 52. Removal of the cover body 52 can then be accomplished by inserting a suitable rod-like tool (not shown) into an aperture 74, provided in the upstanding end wall 25 of the housing, so that this tool (not shown) can be moved into engagement with the vertical surface 57 of the cover body 52 and pushed to disengage the cover body from the detent action provided by the slot 40 and the notches 46 of the housing 20.

As is well known in the art, integrated circuit packages are capable of generating heat while operating and this heat can destroy such packages in the absence of means for dissipating that heat. Therefore, the cover body 52 may be provided with heat conducting and radiating means in the form of a plurality of fin pairs 76 such as copper or other suitable heat conductive material.

Each fin pair 76 is an elongated structure of U-shaped in cross sectional configuration with the two individual upstanding fin members 77 interconnected at the lower ends thereof with a bight member 78. The cover body 52 is formed with a cavity 79 in the bottom surface thereof and a plurality of elongated slots 80 extending from the cavity 79 upwardly through the upper surface 59 of the body 52. The fin pairs 76 are assembled to the cover body 52 by inserting the upstanding fins 77 into the slots 80 to position the bight members 78 within the cavity 79 of the cover body. A resilient body 81 may be interposed between the fin pairs and the cover body so that when the cover assembly 12 is mounted within the base assembly 10, the bight member 78 of each of the fin pairs 76 will be loaded into engagement with the planar substrate 17 of the circuit package 14 for an effective transfer of heat.

It is contemplated that assembly of the circuit package 14 within the connector of the present invention will include the application of a silicone grease (not shown) between the circuit package 14 and the cover body 52. As is well known in the art, silicone grease is a good heat conductor and will therefore enhance heat transfer between the package 14 and the fin pairs 76. Also, the presence of silicone grease (not shown) between the circuit package 14 and the cover body 52 will aid the sliding movement employed to mount the cover body 52 in the housing 20 as hereinbefore described.

Figure 5:
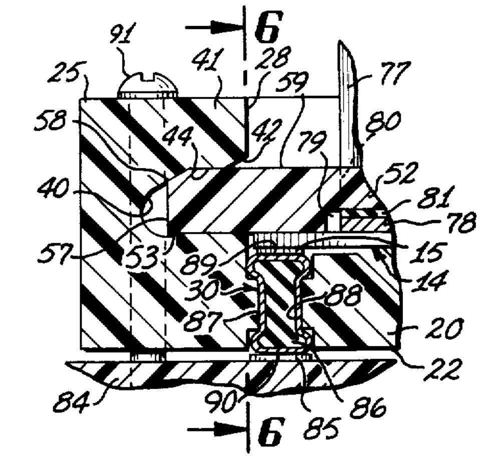
FIG. 5 is an enlarged fragmentary sectional view similar to FIG. 3 and showing a modification of the connector of the present invention.
Figure 6:
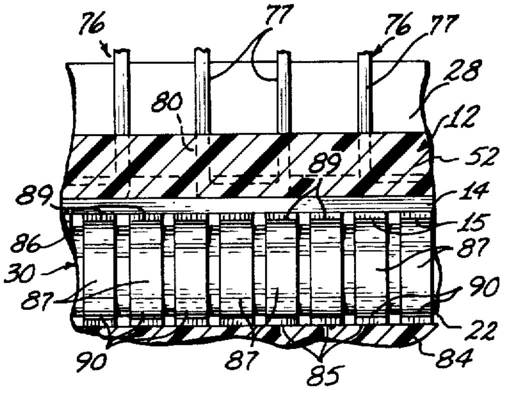
FIG. 6 is a fragmentary sectional view taken on the line 6—6 of FIG. 5.

Referring now to FIGS. 5 and 6 wherein an alternate form of the electrical interconnecting means 30 is shown as being mounted in the base assembly 10 and is employed for electrically interconnecting the leadless package 14 with a backpanel which in this instance is in the form of a printed circuit board 84 having the usual mounting pads 85 thereon. In this embodiment of the present invention, the electrical interconnecting means 30 includes an elongated resilient body 86 of suitable elastomeric material such as rubber. A plurality of flexible electrically conductive ribbons 87 are circumferentially positioned on the resilient body 86 in spaced increments along the length thereof, with the incremental spacing matching the spacing of the terminal pads 15 of the leadless circuit package 14 and the mounting pads 85 of the printed circuit board 84. The resilient body 86 having the conductive ribbons 87 thereon is mounted within an elongated slot 88 provided in housing 20 so that each of the ribbons has a first contact portion 89 extending into the chamber 28 of the housing 20, and a second contact portion 90 extending exteriorly of the housing 20.

When the base assembly 10 of this embodiment is mounted on the backpanel 84, such as with suitable screws 91, the second or downwardly facing contact portion 90 of each of the conductive ribbons 87 will be compressed, or squeezed, into contact with a different one of the mounting pads 85 of the backpanel 84. Likewise, when the cover assembly 12 is mounted within the base assembly 10, as previously described, the first or upwardly facing contact portion 89 of each of the conductive ribbons 87 will be compressed, or squeezed into conductive contact with an aligned one of the terminal pads 15 of the leadless circuit package 14.

It should be understood that one or more of the resilient bodies 86 having the flexible conductive ribbons 87 thereon may be employed for each of the sides of the leadless circuit package 14 having an array of terminal pads 15 thereon. In other words, at least four resilient bodies 86 with conductive ribbons 87 would be employed for mounting the integrated circuit package 14 which has terminal pads 15 provided adjacent to all four edges of the substrate 17 thereof.

Figure 7:
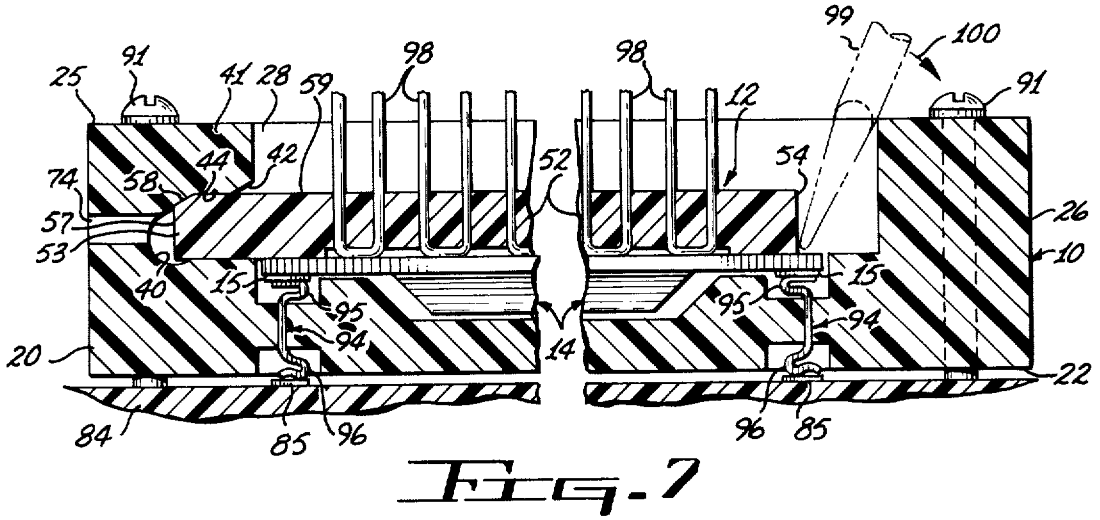
FIG. 7 is a fragmentary sectional view similar to FIG. 3 and illustrating another modification of the connector of the present invention.

FIG. 7 illustrates another embodiment of the present invention wherein the electrically interconnecting means 30 for electrically interconnecting the leadless circuit package 14 with the printed ciruit board 84 includes one conductive element 94 for each electrical interconnection to be made. Each of the conductive elements includes an upwardly facing spring contact portion 95 and a downwardly facing spring contact portion 96. The spring contact portions 95 and 96 are formed with an integral connecting portion which is embedded in the housing 20. When the base assembly 10 is mounted on the backpanel 84, such as with the screws 91, and the cover assembly 12 is mounted in the housing 20, as previously described, pressure interconnections with the terminal pads 15 of the package 14 and the mounting pads 85 of the backpanel 84 will be made as previously described.

FIG. 7 also illustrates a modified form of heat conducting and radiating means which in this embodiment includes a plurality of heat conductive rods 98 shaped in a U-shaped configuration similar to the shape of a staple.

Also in FIG. 7 is shown a modification in the method of mounting the cover assembly 12 within the base assembly 10. The trailing edge 54 of the cover body 52 is of planar configuration so that the required lateral sliding of the cover body 52 may be accomplished by inserting a tool such as a screwdriver 99 between that trailing edge 54 and the upstanding wall 26 of the housing and moving the screwdriver in the arcuate path indicated by the arrow 100. It should be understood that the use of a screwdriver is exemplary only as other devices such as a rotating cam (not shown) could be employed.

While the principles of the invention have now been made clear in an illustrated embodiment, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. A connector for removably mounting a leadless circuit package on a backpanel and electrically coupling the terminal pads of the leadless circuit package to the backpanel, said connector comprising:

a. a housing for mounting on the backpanel, said housing having a pair of upstanding end walls and a pair of upstanding side walls which form the perimeter of an upwardly opening chamber formed therein into which the leadless circuit is nestingly positionable;

b. a cover demountably nestingly positioned within the chamber of said housing atop the leadless circuit package when that package is positioned therein, said cover laterally slidably movable relative to said housing;

c. deflecting and locking means formed in said housing and disposed in the path of sliding movement for deflecting said cover downwardly in the chamber of said housing when said cover is slidably moved into engagement therewith and for locking said cover in the deflecting position; and d. electrical interconnecting means mounted in said housing and extending into the chamber of said housing for engagement with the terminal pads of the leadless circuit package when that package is positioned therein, said electrical interconnecting means extending from said housing for engaging the backpanel when said housing is mounted thereon.

2. A connector as claimed in claim 1 wherein said deflecting and locking means comprises:

a. one of the upstanding end walls of said housing having an inwardly opening elongated slot formed therein into which a portion of said cover is laterally slidable for deflecting and locking engagement therein; and b. each of the upstanding side walls of said housing having at least one upwardly and inwardly opening notch formed therein for receiving portions of said cover and for deflectingly lockingly engaging those received portions of said cover upon sliding movement of said cover.

3. A connector as claimed in claim 1 wherein said deflecting and locking means comprises:

a. one of the upstanding end walls of said housing having an inwardly opening slot formed therein into which a portion of said cover is slidingly movable and which provides an overlaying end wall cantilevered ledge, the end wall cantilevered ledge having an inclined plane surface and a detent surface which upon sliding movement of said cover will deflect and lock said cover in the deflected position; and b. each of the upstanding side walls of said housing having at least one upwardly and inwardly opening notch for receiving portions of said cover and each of which provide an overlaying side wall cantilevered ledge, these latter cantilevered ledges each having and inclined plane surface and a detent surface which upon sliding movement of said cover will deflect and lock said cover in the deflected position.

4. A connector as claimed in claim 1 wherein said deflecting and locking means comprises:

a. one of the upstanding end walls of said housing having an elongated inwardly opening slot formed therein into which a portion of said cover is slidingly movable;

b. an end wall cantilevered ledge formed in the upstanding end wall of said housing and disposed to overlay the slot formed in that end wall and extend toward the chamber of said housing;

c. each of the upstanding side walls of said housing having at least one upwardly and inwardly opening notch formed therein for receiving a portion of said cover therein;

d. a side wall cantilevered ledge formed in each of the upstanding side walls of said housing adjacent the notch formed therein, said side wall cantilevered ledges disposed to overlay a portion of its adjacent one of the notches formed in the side walls of said housing, said side wall cantilevered ledges coplanar with and extending in the same direction as said end wall cantilevered ledge;

e. an inclined plane surface formed on each of said end wall and said side wall cantilevered ledges, said inclined plane surfaces disposed on the lower portions of their respective ones of said end wall and said side wall cantilevered ledges adjacent the extending ends thereof; and f. a detent surface formed on each of said end wall and said side wall cantilevered ledges, said detent surfaces disposed on the lower portions of their respective ones of said end wall and said side wall cantilevered ledges adjacent said inclined plane surface thereof.

5. A connector as claimed in claim 1 wherein said cover is provided with wedge means thereon for engaging said deflecting and locking means upon lateral sliding movement of said cover.

6. A connector as claimed in claim 1 wherein said cover comprises:

a. a cover body of planar configuration having a leading edge, a trailing edge, and a pair of side edges;

b. an inclined planar surface formed on the leading edge of said cover body and which is disposed to slope angularly upwardly and rearwardly to the upper surface of said cover body;

c. at least one ear extending laterally from each of the side edges of said cover body, each of said ears coplanar with said cover body and each having a leading edge which is parallel with and faces in the same direction as the leading edge of said cover body; and d. an inclined plane surface formed on the leading edge of each of said ears and which are disposed to slope angularly upwardly and rearwardly to the upper surface of their respective ones of said ears.

7. A connector as claimed in claim 1 wherein said cover is provided with heat radiating means for dissipating heat produced by the leadless circuit package when that package is mounted within said housing.

8. A connector as claimed in claim 1 wherein said electrical interconnecting means comprises at least one conductive element embedded within said housing, said conductive element having a spring contact portion formed on the end thereof which extends into the chamber of said housing for conductively contacting one of the terminal pads of the leadless circuit package when that package is mounted in said housing, said conductive element having a pin portion on the end thereof which extends from said housing for engagement with the backpanel when said housing is mounted thereon.

9. A connector as claimed in claim 1 wherein said electrical interconnecting means comprises at least one conductive element embedded within said housing, said conductive element having a spring contact portion formed on each of its opposite ends for forming a conductive contact with one of the terminal pads of the leadless circuit package when that package is mounted in said housing and for forming a conductive contact with the background when said housing is mounted thereon.

10. A connector as claimed in claim 1 wherein said electrical interconnecting means comprises:

a. at least one elastomeric body embedded in said housing; and b. at least one flexible electrically conductive ribbon on said elastomeric body and disposed thereon to provide a first contact portion thereof extending into the chamber of said housing and a second contact portion extending exteriorly of said housing.

11. A connector as claimed in claim 1 further comprising tool means movably mounted in said housing for slidingly moving said cover into engagement with said deflecting and locking means.

* * * * *